United States Patent [19]
Chang et al.

[11] Patent Number: 4,801,986
[45] Date of Patent: Jan. 31, 1989

[54] VERTICAL DOUBLE DIFFUSED METAL OXIDE SEMICONDUCTOR VDMOS DEVICE WITH INCREASED SAFE OPERATING AREA AND METHOD

[75] Inventors: Hsueh-Rong Chang, Scotia; Bantval J. Baliga; Tat-Sing P. Chow, both of Schenectady, all of N.Y.

[73] Assignee: General Electric Company, Schenectady, N.Y.

[21] Appl. No.: 33,940

[22] Filed: Apr. 3, 1987

[51] Int. Cl.$^4$ .............................................. H01L 29/78
[52] U.S. Cl. .................................. 357/23.4; 357/23.8; 357/13; 357/20
[58] Field of Search ..................... 357/23.4, 23.8, 13, 357/20

[56] References Cited

U.S. PATENT DOCUMENTS

| | | | |
|---|---|---|---|
| 4,308,549 | 12/1981 | Yeh | 357/23.8 |
| 4,561,003 | 12/1985 | Tihanyi | 357/23.4 |
| 4,641,162 | 2/1987 | Yilmaz | 357/23.4 |

FOREIGN PATENT DOCUMENTS

| | | | |
|---|---|---|---|
| 0160183 | 11/1985 | European Pat. Off. | 357/23.8 |
| 55-78574(A) | 6/1980 | Japan | 29/78 |
| 56-88362 | 7/1981 | Japan | 357/23.4 |
| 61-168263 | 7/1986 | Japan | 357/23.8 |

OTHER PUBLICATIONS

*IEDM* 1985 Nakagawa et al., "Experimental . . . MOSFET Characteristics", pp. 150–153, Wash., D.C., Dec. 1–4, 1985.

*Primary Examiner*—Andrew J. James
*Assistant Examiner*—Jerome Jackson
*Attorney, Agent, or Firm*—Robert Ochis; James C. Davis, Jr.; Marvin Snyder

[57] ABSTRACT

A power field effect device has a gate grid having a plurality of elongate openings therein through which a base region forming a high voltage blocking junction with the underlying body was diffused. The openings have round ends in order to prevent the formation of spherical portions in the high voltage blocking junction. The round ends of adjacent openings are positioned close enough to each other that their diffusion regions merge, thereby raising the device breakdown voltage to that of the cylindrical junction portion along the straight edges of the junction. In an alternative embodiment, the openings do not have round ends and are positioned close enough together that their diffusions merge end to end.

23 Claims, 10 Drawing Sheets

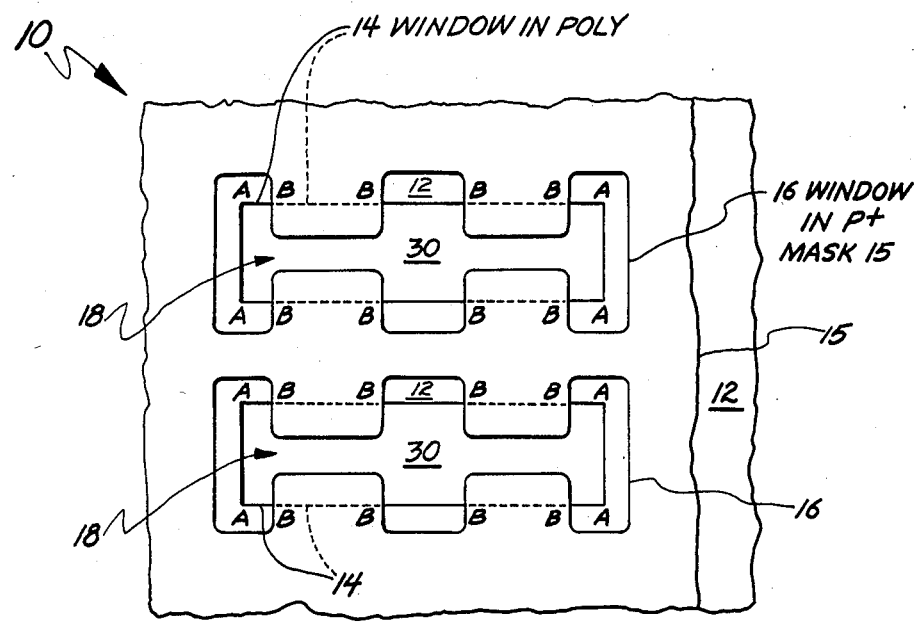
Fig. 1 _PRIOR ART_
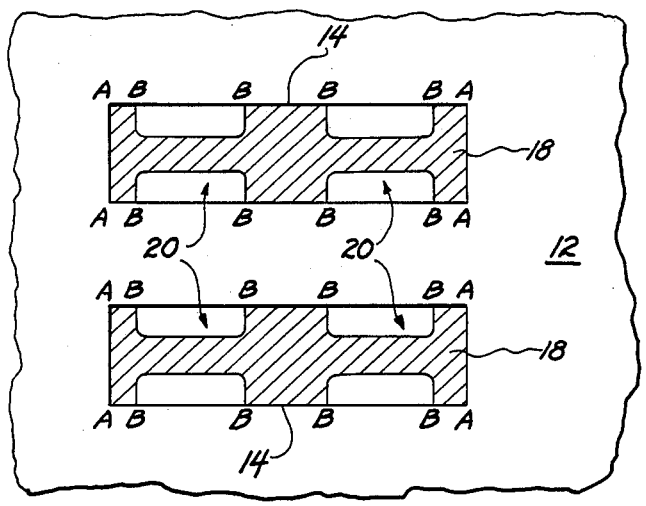
Fig. 2 _PRIOR ART_

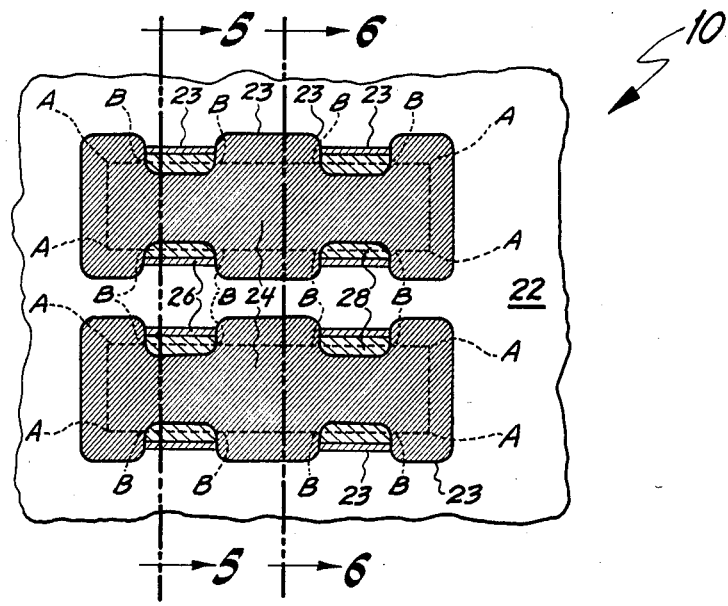
Fig. 3 _PRIOR ART_
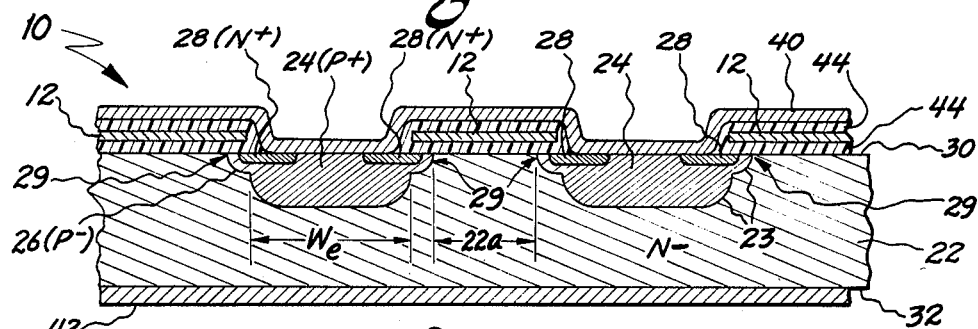
Fig. 5 _PRIOR ART_
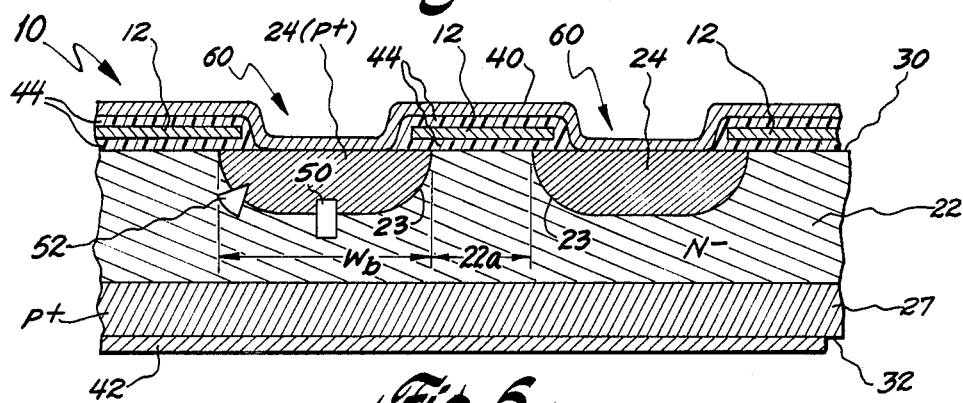
Fig. 6 _PRIOR ART_

(VIEW INVERTED RELATIVE TO FIGURES 5 & 6)

(VIEW INVERTED RELATIVE TO FIGURES 13 & 14)

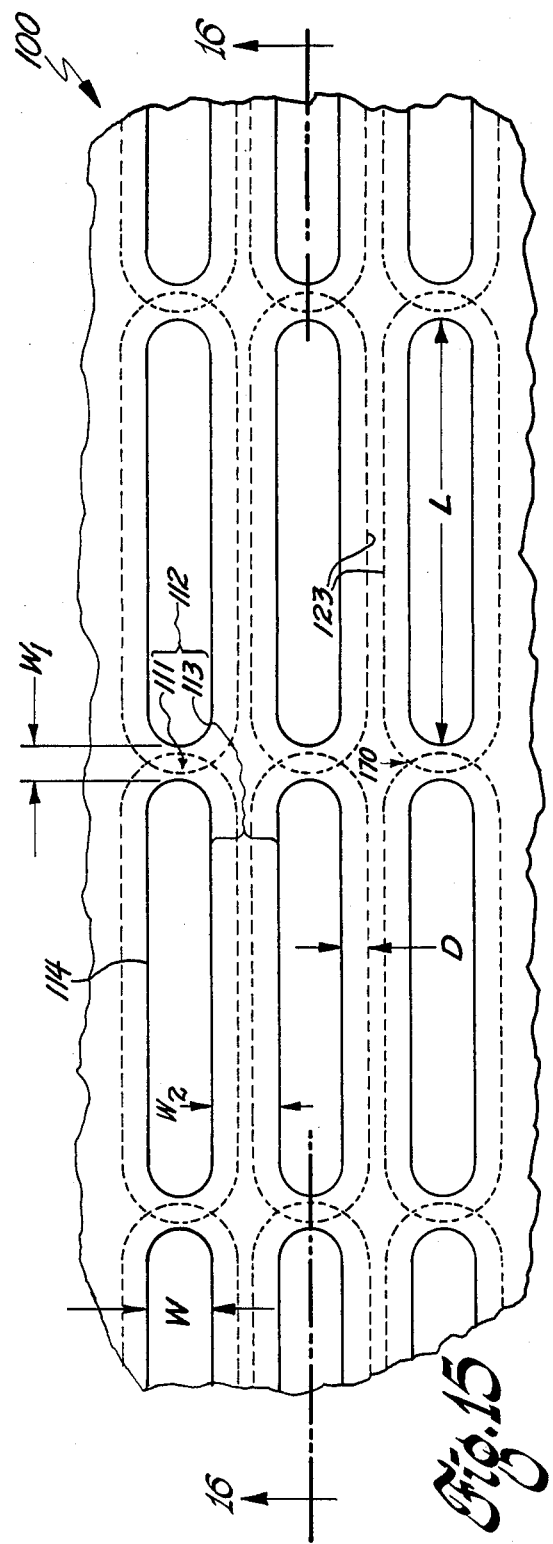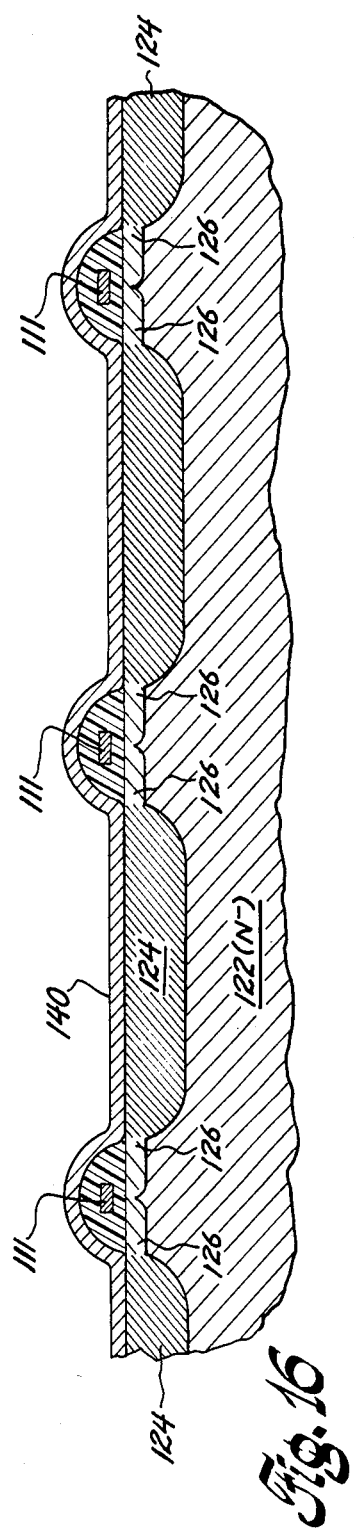
Fig. 15
Fig. 16

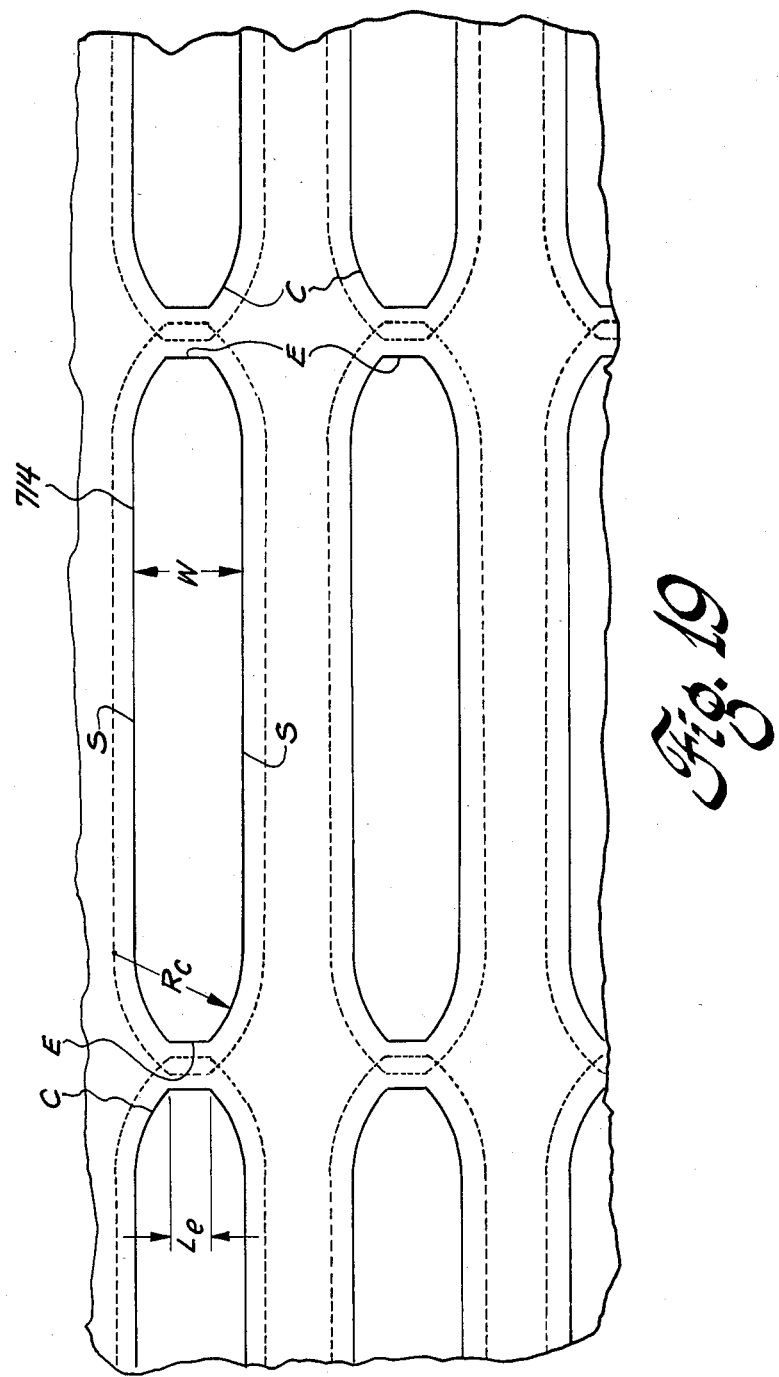

VERTICAL DOUBLE DIFFUSED METAL OXIDE SEMICONDUCTOR VDMOS DEVICE WITH INCREASED SAFE OPERATING AREA AND METHOD

REFERENCE TO A RELATED APPLICATION

A related patent application entitled "Vertical Double Diffused Metal Oxide Semiconductor (VDMOS) Device Including A High Voltage Junction Exhibiting Increased Safe Operating" by the present inventors, B. J. Baliga, T. P. Chow and H-R Chang, Ser. No. 033,952 filed on even date herewith, is assigned to the same assignee and is incorporated herein by reference in its entirety.

FIELD OF THE INVENTION

The present invention relates to the field of semiconductor field effect devices and more particularly, to such devices having increased safe operating areas.

BACKGROUND OF THE INVENTION

When field effect devices such as insulated gate bipolar transistors (IGBTs) must turn off a high current with an inductive load, the device must support the high voltage induced by stopping the current in the inductive load while high charge concentrations are still present within the device because of the high current which was flowing while the device was on. The problem also exists for metal-oxide-semiconductor field effect transistors (MOSFETs), but is less severe because MOSFETs are majority carrier devices. The concurrent limits on safe values of current and voltage define a device operating region known as the safe operating area (SOA) of such a device. That is, as long as the current and voltage are both within the safe operating area, the device will not be damaged and will be successful in turning off an inductive load. If the current/voltage to which the device is subject exceeds the safe operating area, then the device often fails. The SOA of a device is expressed in terms of a maximum load current and an applied voltage. However, that specified load current is actually determined by the active area of the device and the maximum charge density which its semiconductor structure can support at the specified applied voltage without undergoing device breakdown. The current density which creates this charge is normally expressed in amperes per square centimeter ($A/cm^2$).

It is known to increase the safe operating area of a device by increasing its physical area to reduce the current density to which the semiconductor material is subject at a given load current. However, this has the undesirable effect of decreasing processing yield and the maximum number of devices possible per processed wafer, both of which increase device cost. It is also known to increase the resistivity of the drift region of the device to increase the voltage at which the device breaks down. This has the undesirable effect of increasing the on-resistance of the device and its forward voltage drop when the device is on.

A known type of metal-oxide-semiconductor (MOS) power device having a main current path which includes a portion which is vertical through the thin dimension of the semiconductor includes a gate electrode grid having a rectangular array of rectangular windows therein through which the device active regions are double diffused. Minority carrier bypass sites are included in these windows as well as emitter regions. These minority carrier bypass sites and emitter regions are introduced by extending the high concentration base diffusion to the edge of the window to produce the bypass sites and spacing it from the edge of the window at the emitter sites. We have found that this configuration limits the safe operating area.

Accordingly, an object of this invention is to provide a technique which increases the safe operating area of a semiconductor field effect power device without requiring an increase in the device area or the resistance of its drift region.

Another object is to increase the safe operating area of a semiconductor field effect power device while retaining high gate grid conductivity.

SUMMARY OF THE INVENTION

The present invention increases the safe operating area of a field effect device by modifying the high voltage blocking PN junction so that it is free of spherical portions. Spherical portions of the high voltage blocking PN junction which are present along the sides of the diffused regions at the transition between emitter and minority carrier bypass sites in prior devices are eliminated by spacing any high concentration base diffusion from the sides of the window and by providing any minority carrier bypass sites by omitting (masking) the emitter diffusion at the bypass sites.

In one embodiment spherical portions of the high voltage blocking PN junction at the ends of the diffused regions which are caused by the rectangular corners at the ends of the windows in the gate electrode grid in prior device are replaced by junction portions which are cylindrical with a semicircular axis by making the ends of the windows semicircular with a radius of at least one half of the window's width.

In another embodiment (which may incorporate the round ended windows) the device is provided with an insulated gate electrode grid which includes narrow first portions having a minimum width $W_1$, and wide second portions having a minimum width $W_2$, where $W_2$ is greater than $W_1$. The conductivity type determining dopant whose diffusion creates the device's high voltage blocking junction is diffused through the windows in the gate grid for a distance D along the device surface under the gate grid, where $\frac{1}{2}W_2$ is greater than D which is greater than $\frac{1}{2}W_1$, so that the diffusions proceeding from opposite sides of the narrow portions of the gate grid merge, thereby eliminating the ends of the diffused regions under those narrow portions of the gate and thus the junction ends there. This is accomplished by employing masks which (1) define a gate grid having narrow portions having a width $W_1$, and wide portions having a width $W_2$ and driving the subsequent diffusion a distance D under the gate along the semiconductor surface, where $\frac{1}{2}W_2$ is greater than D which is greater than $\frac{1}{2}W_1$, (2) space any high concentration base diffusion from the sides of the windows in the gate and (3) create any minority carrier bypass locations by masking the emitter diffusion.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings(s) in which:

FIG. 1 is a plan view showing windows in the polysilicon gate in a prior art vertical current MOSFET or IGBT with the high concentration base diffusion mask overlaid on the windows;

FIG. 2 is a plan view showing the area in the device of FIG. 1 in which the high concentration base dopant is deposited prior to diffusion;

FIG. 3 is a plan view showing of the shape of the diffused regions in the completed prior art device of FIG. 1;

FIGS. 5 and 6 are cross-sections through the prior art device of FIG. 3 taken along the lines 5—5 and 6—6, respectively, in FIG. 3;

FIG. 15 is a plan view showing a portion of the gate grid of a device in accordance with the present invention;

FIG. 16 is a cross-section through the structure of FIG. 15 along line 16—16 in FIG. 15; and FIGS. 17-19 are plan views showing alternative embodiments of devices having a gate grid in accordance with the present invention.

DETAILED DESCRIPTION

Figure 4:
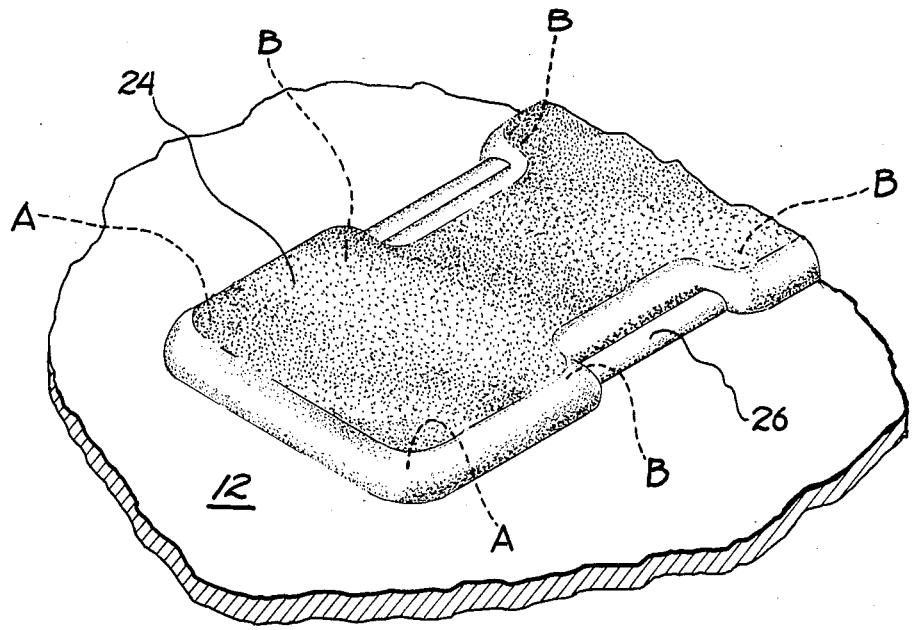
FIG. 4 is an inverted perspective view of the lower surface of one of the regions which forms the high voltage blocking junction in the prior art device of FIGS. 1-3.

In FIG. 1 in plan view, a portion of a power field effect device 10 is illustrated during the process of fabrication. A polysilicon gate layer 12 is disposed on an insulating layer 44 (shown in FIGS. 4 and 5) over the surface 30 of a semiconductor wafer which is lightly doped with N type impurities and is thus of N− conductivity. Rectangular openings or windows 14 are created in the polysilicon layer 12 and the insulating layers 44 to form the gate electrode grid of the final device and to expose the surface 30 of the semiconductor material in order to diffuse device active regions therethrough into the underlying N− material. A mask 15 having windows 16 therein is overlaid on the polysilicon layer 12 with the windows 16 in the mask aligned with the windows 14 in the polysilicon gate in order to define the desired locations 18 for a P+ (high concentration) base diffusion. The locations 18 are that part of the surface 30 which are within a window 14 *and* a window 16.

In FIG. 2, the gate electrode layer 12 and the windows 14 therein are again shown with the areas 18 in which the P+ base dopant is disposed shaded for clarity. It should be noted, for reasons to be discussed subsequently, that each of the P+ dopant locations 18 has four right angle corners (A) at the corners of its window 14 and eight right angle corners at points B where, as shown in FIG. 1, its window 16 in the P+ mask 15 extends to the edge of its window 14. During diffusion of the high concentration of P type dopant which forms the P+ region, oxide grows in the regions 18. After completion of the P+ diffusion, the P+ masking material in areas 20, shown in FIG. 2, is removed without removing the oxide over the regions 18. P− (low concentration P type) regions are then diffused through areas 20 with the polysilicon 12 and the oxide over the P+ regions (area 18) serving as a diffusion mask. During this diffusion, the P− regions merge with the P+ region to create a single base region under each window 14. Following diffusion of the P− regions, an N+ source or emitter region is diffused through the same openings 20. The oxide over regions 18 is then removed.

FIG. 3 shows, in plan view, the location at the semiconductor surface of the final diffused regions of the device in relation to the edges of the windows 14 which are shown dotted in FIG. 3. FIG. 4 is a perspective view of the device inverted from its position in FIG. 3 showing only the insulated gate electrode 12 and the P type diffused regions 24 and 26. In the vicinity of each of the points A and B, the diffused junction has a generally spherical contour (⅛ of a sphere centered at the associated corner A or B) because that portion of the diffused region was formed by outward/downward diffusion (FIG. 3 view or upward/outward diffusion in the FIG. 4 view) from the associated corner A or B. Between two adjacent spherical portions of the junction, the junction is cylindrical because that portion of the junction was formed by outward/downward diffusion (FIG. 3 view or upward/outward diffusion in the FIG. 4 view) form a straight line edge of the dopant source area 18. Throughout this specification, the term "cylindrical junction" is used in the common meaning of the word "cylinder", that is, a cylinder having a circular cross section rather than in accordance with its much broader mathematical definition of which many people are unaware. The meaning given the term "cylindrical junction" herein is in accordance with common usage in the semiconductor industry. In the FIG. 3 view, the P+ diffused regions 24 extend outward beyond the edges of the windows 14 everywhere where the P+ dopant introduction pattern 18 extends to the edge of the window 14. The P− diffused regions 26 extend a lesser distance outward because they were introduced later and driven in for a shorter time. The N+ diffused regions 28 in turn extend outward under the polysilicon a lesser distance from the windows 14 than the P− regions 26 for the same reason. The high voltage blocking junctions 23 of FET device 10 follow, in FIG. 3, the outer edges of the P+/P− base diffused region and in FIG. 4 the surface of the P type region comprised of diffused regions 24 and 26. That is, in FIG. 3, junction 23 runs from the upper lefthand corner A along the top of the diffused region to the upper righthand corner A, thence down to the lower righthand corner A and back along the bottom of the diffused region to the lower lefthand corner A and up to the starting corner. Thus, the PN junction 23 has a complex shape which is very undulatory and exhibits a spherical contour centered at each of the corners A and B of the diffusion as seen more clearly in FIG. 4. The intersection of the blocking junction 23 with the semiconductor surface forms a closed geometric figure whose center is within the base region.

In the cross-section shown in FIG. 5, the vertical and horizontal relationships among the P+, P− and N+ diffused regions (24, 26 and 28, respectively) and the polysilicon gate 12 and the underlying lightly doped N type material 22 are illustrated. The P+ diffused regions 24 extend deeper into the N− layer 22 than the P− or N+ diffused regions 26 and 28. Along the cross-section in FIG. 5, the P− and N+ diffused regions extend further under the polysilicon than the P+ diffused region 24. The doping level of the P+ region is substantially higher than that of the P− region 26. By substantially higher doping, we mean that the more heavily doped region has a doping concentration which is at least an order of magnitude (that is at least a factor of ten) higher than the doping concentration in the other regions. In FIG. 5 the polysilicon 12, which comprises the gate electrode of the final device, extends over part of the N+ region 28, part of the N− region 22 and the portion of the P− region 26 between them. In FIG. 6 the P+ region 24 extends under the polysilicon 12. Insulating (dielectric) material 44 insulates the gate electrode 12 from the underlying semiconductor material and an overlying electrode 40. The overlying electrode 40 contacts the N+ diffused regions 28 and the P+ diffused regions 24. In so doing, it shorts the PN junction between the N+ region 28 and the P+/P− region on the side of the N+ region 28 more distant from the gate electrode 12. This is desirable because it helps prevent latching when the device incorporates therein an insulated gate bipolar transistor (IGBT) portion as shown in FIG. 6 which includes a P+ layer 27 between layer 22 and the second power electrode 42 which is disposed in contact with the lower surface 32 of the semiconductor material. The width $W_e$ of the P+ diffused region 24 at the emitter sites as shown in FIG. 5 is less than the width $W_b$ of the P+ diffused region 24 at the minority carrier bypass sites 60 as shown in FIG. 6. This difference is seen more clearly in FIG. 4. The device in FIG. 5 would also be an IGBT if the P+ layer 27 were present there.

During device operation, application of a bias voltage to the gate electrode 12 is used to control conduction of electrons through channels 29 near the surface of the P− region 26 between the N+ emitters 28 and the N− region 22. This control can be either in an enhancement mode or a depletion mode with an appropriate bias applied at times when it is desired to hold the device in a different condition than occurs in the absence of gate bias.

To turn the device 10 on, an appropriate voltage is applied across the main electrodes 40 and 42 (for example, with electrode 42 more positive than electrode 40) and the gate electrode layer 12 is placed and held in a bias condition in which the channels 29 are conductive. Electrons then flow from electrode 40 into N+ emitters 28, horizontally through channels 29 and vertically through the N− region 22 to the electrode 42. In an IGBT such as shown in FIG. 6, holes simultaneously flow vertically upward in N− region 22 and across the PN junction 23 to the first electrode without entering N+ regions 28.

When it is desired to turn the device off, the bias condition of the gate electrode layer is changed to one which causes the channel 29 to close and block conduction of electrons from the emitters 28 to the N− region 22. At that point, i.e., with the channels blocked, the current in an MOS device has several significant components. These are (in the case of a MOSFET) (1) electrons remaining from the on-current, (2) hole and electron displacement currents associated with the increasing width of the depletion region as a result of the large reverse voltage applied across the device and (3) hole and electron avalanche currents. Other non-significant currents are also present. In an MOS bipolar device such as an IGBT, another current component, that comprised of holes in the body region 22, becomes significant because of the large number of holes there as a result of the bipolar injection of holes from the P+ region 27 while the device was on.

The components of device current other than the avalanche current are essentially independent of junction curvature, but the avalanche component is strongly effected by junction shape. The avalanche current is generated primarily at regions having high charge densities.

The causes of avalanche breakdown are the same in a MOSFET and an IGBT; however, for two devices which have the same MOS structure, the IGBT will break down at a lower voltage than the MOSFET under identical circuit conditions because of the presence of the additional hole charge which results from the bipolar nature of the IGBT.

When an inductive load is being controlled, the above-described turn off of the channel cannot immediately stop the load current because of the current maintenance characteristics of the inductive loads. This results in a substantial increase in voltage across the semiconductor device because the rapid change in load current causes a large di/dt in the inductive load which produces a high inductive load voltage. Consequently, the turn off of the channel causes the voltage across the device between electrodes 40 and 42 to increase to significantly more than the supply voltage. This puts considerable stress on the semiconductor device, especially when it is an IGBT and therefore has a large number of minority carriers in the N− body region 22.

The electric field across the high voltage blocking PN junction 23 terminates on charges within the semiconductor material and is sustained over a distance which is determined by the applied voltage, the shape of the junction and the quantity of mobile charge present. Along the flat portion of the PN junction, the size of the rectangular volume 50 (FIG. 6) required to enclose enough charge carriers to terminate the entire field determines the applied field strength and, under static conditions, depends on the doping level of the depletion regions and the applied voltage. Where the PN junction 23 curves upward toward device surface 30, the region in which the electric field is terminated changes to more of the sector or wedge shape shown at 52. This is because on the inside of the PN junction within the P region (the more highly doped side of the PN junction here), fewer carriers are available to terminate the field than on the outside of the junction because of the reduced volume of P type material per unit of junction area adjacent the junction as a result of the inward curving of the junction. Conversely, the junction shape results in charge carriers over a wider area being available on the N− type (more lightly doped here) side of PN junction 23 for terminating the field there. As a result, the applied voltage is terminated over a shorter distance into the N− material and over a longer distance into the P+ material at the curved portion of the junction than at a flat portion of the junction. This results in a higher electric field along the curve of the junction than along planar portions of the junction and the generation of more avalanche current at curved portions of the junction than along the planar portions of the junction. As a result, the curved portion of the junction breaks down at a lower device voltage than the flat portion of the junction.

This effect is present along the entire straight edge of a diffused region where the resulting junction is a portion of a cylinder because the junction curves upward to the surface. The cylindrical portion of the junction typically breaks down at about 80% of the voltage at which a similar parallel plane junction breaks down. The effect of junction curvature is even more pronounced at corners A and B in the device shown in FIGS. 3 and 4 because the junction there is spherical so as to curve in two mutually perpendicular planes and the effects of these curvatures add, so that more avalanche current is generated at the spherical portions of the junction than at the cylindrical portion of the junction for a given device voltage. If the avalanche current becomes too great, the device breaks down. Consequently, it is the spherical portion of the junction which breaks down first in response to over voltage as a result of interrupting a high current in an inductive load. The spherical portion of the junction typically breaks down at about 60% of the voltage at which a similar parallel plane junction breaks down. Thus, the spherical portions of the high voltage blocking junction limit the device's safe operating area. What is significant is the curvature of the junction in three dimensions as shown in FIG. 4.

The field intensity at the junction is further increased by the presence of the mobile charge carriers in the on-state current which are still present during turnoff. Holes in region 22 are attracted toward the junction 23 by the reverse bias voltage and add to the positive charge in the depletion region (which extends outward from the junction 23 into the N− type material) as they cross that depletion region. That depletion region is depleted of electrons by the applied reverse bias, leaving positively charged donor atoms in the depletion region. This added mobile positive charge while present results in an increased electric field strength across the junction. These holes, which are accelerated by the electric field within the depletion region, can contribute to the generation of avalanche current by incurring ionizing collisions each of which generates a hole-electron pair. The overall effect is that the presence of the mobile charge carriers which remain from the on-state current leads to avalanche breakdown at a lower device voltage than that at which avalanche breakdown would occur if those mobile charge were not present.

Those holes, which cross the PN junction 23 in the vicinity of the central conductive column 22a (FIG. 5), must pass through the P− region 26 underneath the emitter region 28 and then travel through P+ region 24 all the way to the electrode 40 in order to be collected by that electrode. This lengthy, relatively high resistance minority carrier path (especially through the relatively thin portion of region 26 between emitter 28 and body region 22) can create a large enough voltage drop in region 26 to forward bias the PN junction between regions 26 and 28. Forward bias on this junction creates currents which can result in the IGBT latching-up like a thyristor which results in loss of gate control. It is for this reason that minority carrier bypass portion 60 of regions 24 such as those shown in cross-section in FIG. 6 are provided which have no emitter region. These carrier bypass regions 60 enable the holes to travel a much shorter and wider (and thus lower resistance) path through P+ region 24 from the junction 23 to the electrode 40 and thereby reduce the tendency to forward bias the junction between regions 26 and 28.

Figure 7:
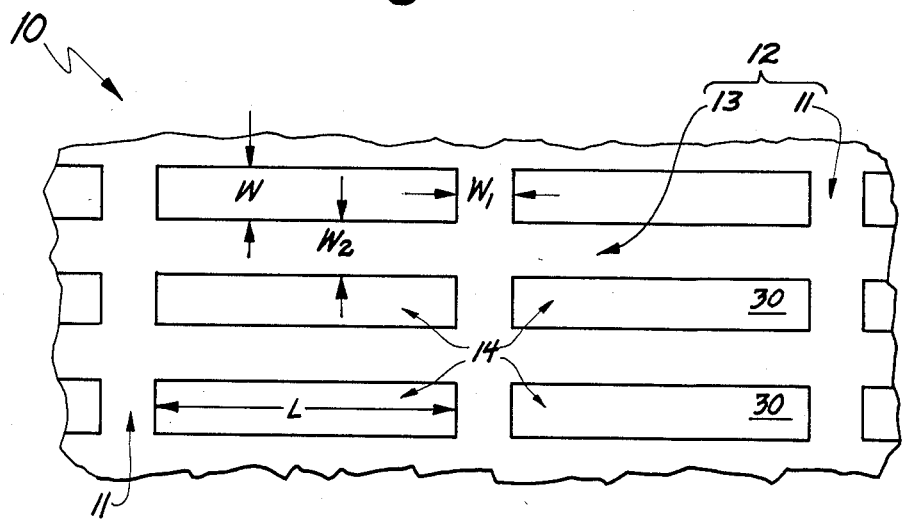
FIG. 7 is a plan view of a larger segment of the gate layer in the prior art device showing more windows.

A portion of prior art device 10 containing a plurality of windows 14 in polysilicon gate electrode 12 is illustrated in FIG. 7. These windows have a width W and a length L. It is common practice in the industry to space the windows horizontally in the figure by cross connection segments 11 of the gate electrode having a width $W_1$ and to space them vertically in the figure by segments 13 of the gate electrode having a width $W_2$ and to make $W_1$ equal to $W_2$. The length L of the windows is somewhat arbitrary. The cross connection segments 11 of the gate electrode which separate the longitudinally aligned windows are included in the gate structure in order to provide a gate grid having a sufficiently high conductivity to avoid limiting device operating characteristics through gate delays. The width W of the windows is kept small to maximize the active area of the device. The width $W_2$ of the gate segments 13 which space the windows apart vertically in FIG. 7 is kept small for the same reason. In an IGBT designed to have a breakdown voltage of 500 volts, typical spacings and sizes are W=16 microns, L=300 microns, $W_1$=16 microns and an $W_2$=16 microns. From these dimensions, it is apparent that the drawings are not to scale and have the dimension W of the windows stretched relative to the dimension L since in the device the ratio W:L is 16:300 which is about 1:20. Thus, the gate segments 13 have a width-to-length aspect ratio which is far from unity. The length L of 300 microns is limited by the need to place cross connections 11 close enough together within the polysilicon gate grid to maintain the desired gate conductivity without using two levels of metallization while still retaining all the self alignment benefits provided by the double diffusion MOS fabrication techniques. This window length L is made as long as possible in order to maximize the active area of the device.

PREFERRED EMBODIMENTS

Our invention is founded on controlling the shape of the high voltage blocking junction to maximize the voltage at which it produces enough avalanche current to cause device breakdown.

The breakdown voltage and thus the safe operating region of devices in accordance with the present invention is increased over that of the prior art device 10 shown in FIGS. 1–7 by modifying the gate mask and the mask for the regions 24 and 26 to eliminate spherical junctions. This is done by modifying the shape and/or width of the cross connection segments of the gate grid which separate longitudinally aligned openings or windows 14 in the gate polysilicon and the masks which are used to control the shape and location of the diffused regions 24, 26 and 28.

Figure 8:
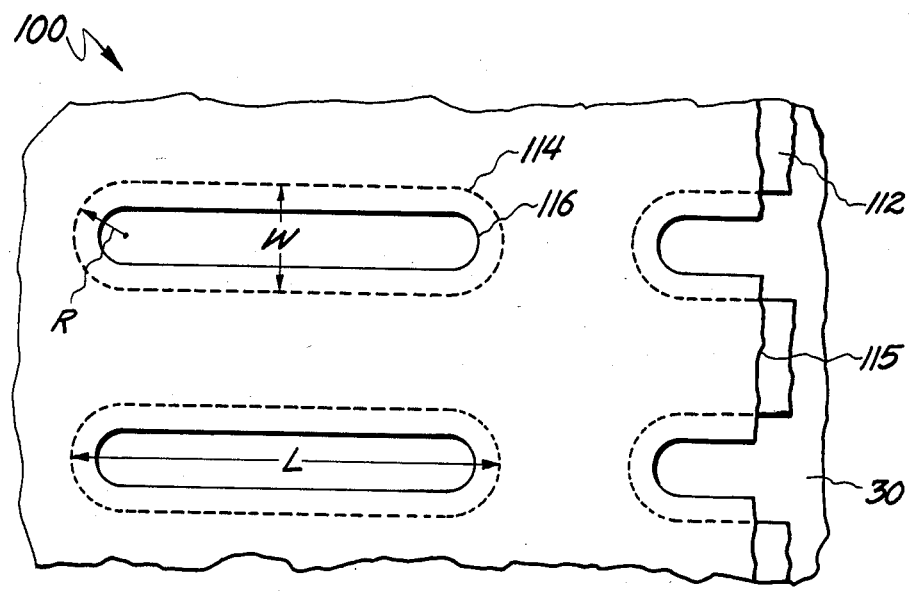
FIG. 8 is a plan view, which is partially cut away, showing the gate grid overlain by a high concentration base diffusion mask used to fabricate a device in accordance with the present invention.

A device 100 in accordance with the present invention is illustrated in plan view in FIG. 8 at the same stage in its fabrication as the device 10 is shown in FIG. 1. Throughout the subsequent figures different devices of the invention are given reference numerals with different prefixes based on 100, 500, 600 and 700. Similar structures retain the same final two digits in their reference numerals from device to device.

The invention is applicable to a variety of field effect power devices and is most effective in those devices having a double diffused (DMOS) field effect structure in which current flow is vertical (sometimes referred to as VDMOS to distinguish it from those DMOS devices in which current flow is lateral which are then referred to as LDMOS devices). Such devices can include devices whose operation is based exclusively on field effects such as MOSFETs and devices which combine field effect and bipolar structures such as insulated gate thyristors, insulated gate turn off thyristors and insulated gate bipolar transistors (IGBTs). In general, the invention is useful in power MOS and other semiconductor devices including bipolar devices whose safe operating area is limited by the breakdown voltage of its high voltage blocking PN junction.

In accordance with the present invention, a VDMOS device 100 has round ended openings or windows 114 formed in its polysilicon layer 112. The windows 114 may have the same width W and length L as the windows 14 in the prior art device 10, shown in FIGS. 1–7. However, windows 114 differ significantly from the prior art windows 14 in that the windows 114 are free of sharp corners and have rounded ends whose radius of curvature is preferably made as large as possible and in particular, in the embodiment illustrated, equal to one-half the width of the window 114. A radius of more than half the window's width may be provided by making the end of the window an expanded bulb. While ends having smaller minimum radii of curvature (less than half the window's width) may be used, they can reduce the benefits provided by the invention. It is preferred to have the radius of curvature R of the round end of the window constant in order to maximize its minimum value.

In FIG. 8, the radius of curvature R of a round-ended window is constant for the whole end of the window, that is, the end of the window is a semicircle. The end of a region diffused through this window is also a semicircle. Such a region has a cylindrical junction along its straight sides and a junction along its ends which may be described as a cylindrical junction having a semicircular axis whose radius R is equal to $\frac{1}{2}$W. If the radius R is made smaller and still equal to W/2 (i.e., W also smaller), then the axis of the curved cylindrical junction has a smaller radius of curvature and the curvature of the junction increases and the junction breakdown voltage decreases. In that configuration (R=W/2) in the limit as R approaches zero, the curvature of the junction and its breakdown voltage both approach that of a sphere. Similarly, if R is increased, the curvature is reduced and the breakdown voltage increases. In the limit as R approaches infinity, the curvature of the junction and its breakdown voltage both approach the values for straight cylindrical junctions.

Figure 9:
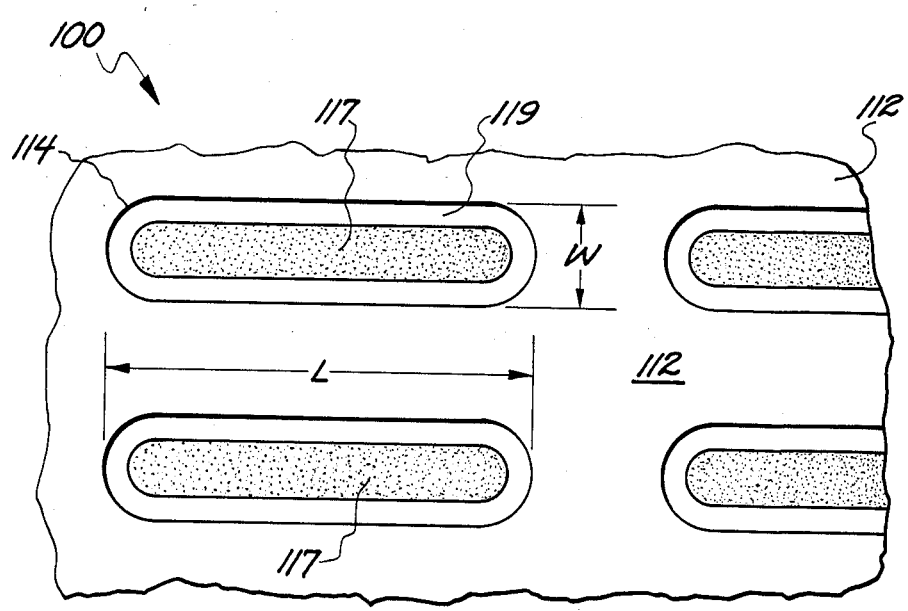
FIG. 9 is a plan view similar to FIG. 8 showing the device after the high concentration base diffusion.
Figure 10:
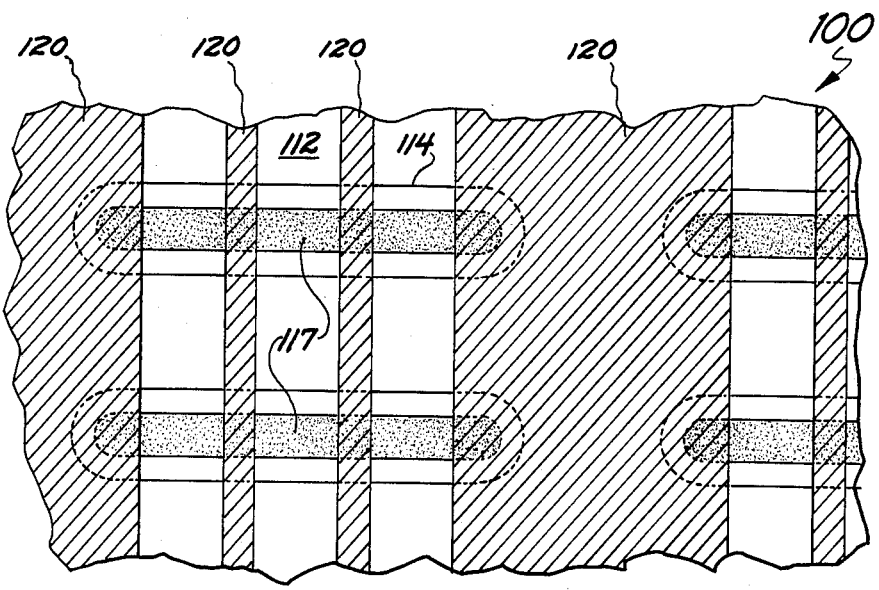
FIG. 10 is a plan view of an emitter mask in accordance with the present invention, overlain on the structure of FIG. 9.

In FIG. 8, the P+ (high concentration base) diffusion mask 115 has windows 116 which are substantially smaller than and situated within the windows 114 and have rounded ends similar to the windows 114. The windows 116 have straight long edges and are narrower in the vertical direction in the figure than the windows 16 used in the fabrication of the prior art device in order to everywhere space the P+ diffusion inwardly from the edge of the polysilicon 112. Once the P+ diffusion has been performed, the P+ diffusion mask 115 is removed leaving in place the oxide 117 which grows over the P+ diffusion site during the diffusion process as shown in FIG. 9. The P− diffusion is made through the new annular windows 119 which exist between the edge of the oxide 117 and the edge of the window 114 in the polysilicon. After the P− diffusion has been performed, an emitter or source mask having diffusion blocking regions 120 is placed over the device as shown in FIG. 10. The regions 120 of this emitter mask block diffusion of N+ emitter regions in the curved ends of the windows 114 and at spaced locations along the length of the windows 114 in order to provide minority carrier bypass sites while the oxide 117 blocks diffusion by emitter dopant into the main portion of the high concentration base diffusion. These minority carrier bypass sites are desirable for the same reasons that minority carrier bypass sites are desirable in the prior art device as discussed above. After the emitter diffusion is performed, the emitter mask is removed as is the oxide 117.

Figure 11:
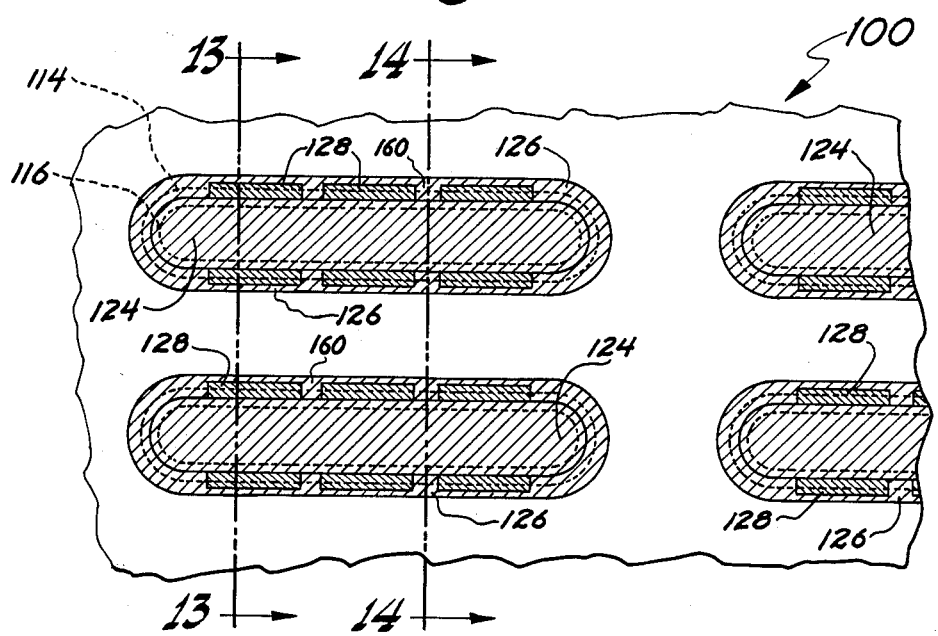
FIG. 11 is a plan view showing the shape of the diffused regions of the final inventive device.
Figure 12:
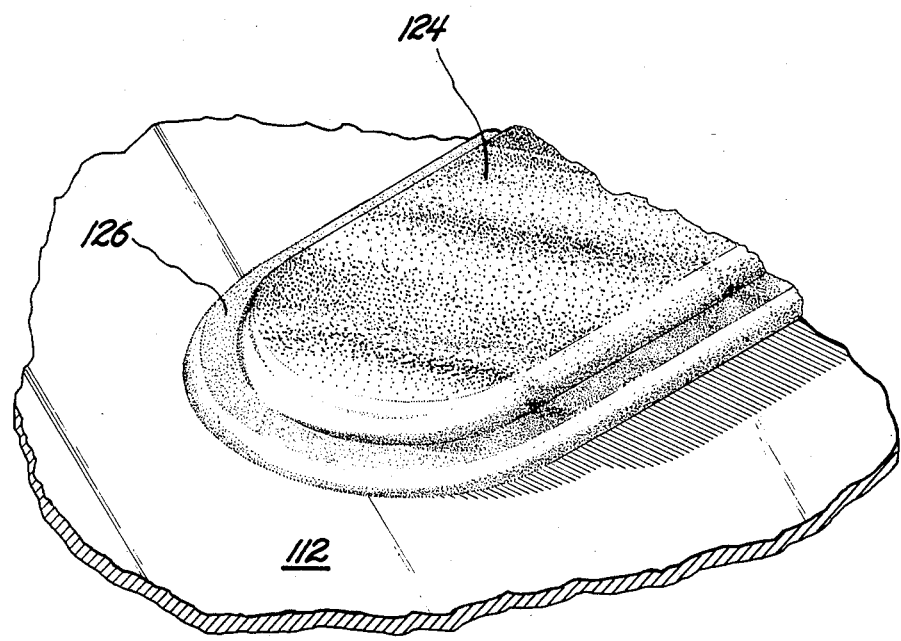
FIG. 12 is an inverted perspective view of a portion of the inventive device similar to the FIG. 4 view of the prior art device.
Figure 13:
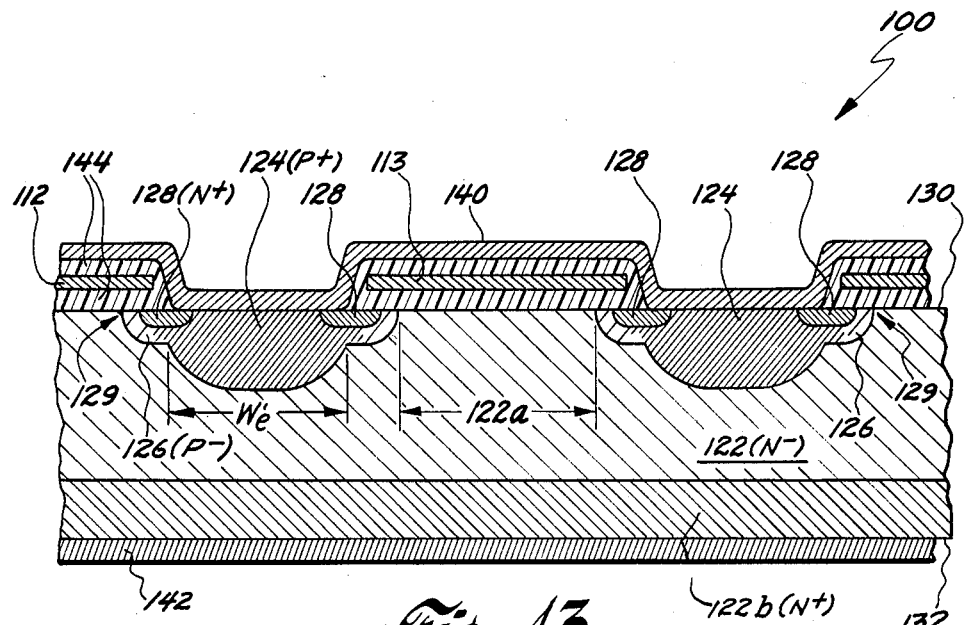
FIGS. 13 and 14 are cross-sections through the inventive device taken along the lines 13—13 and 14—14, respectively, in FIG. 11.
Figure 14:
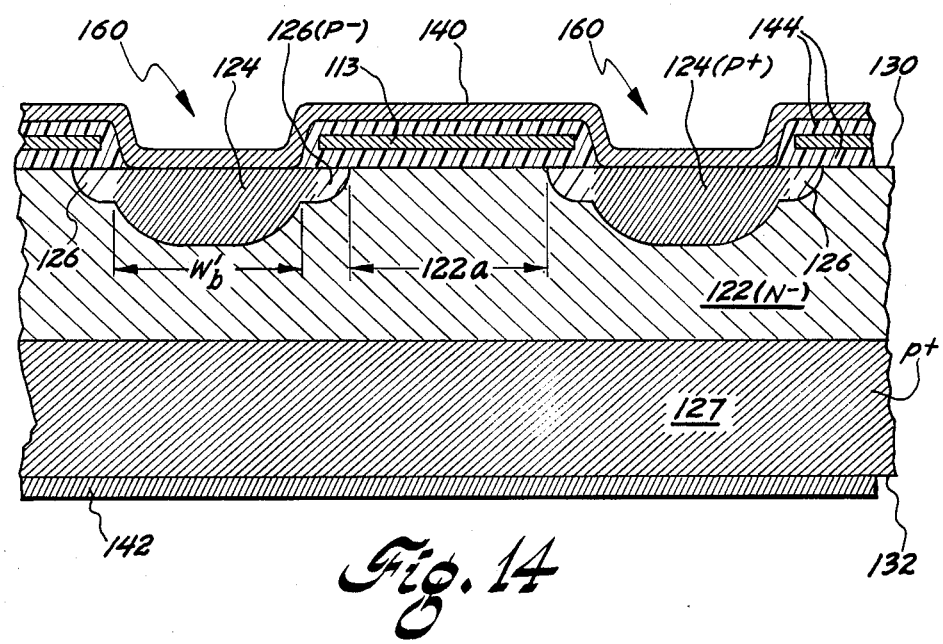

After completion of the emitter diffusion, the device structure appears in plan view as shown in FIG. 11 and in an inverted perspective view in FIG. 12 which is similar to the FIG. 4 view of prior art device 10 and in cross-section in FIGS. 13 and 14. The cross section in FIG. 13 is taken through emitters (sources) 128 along line 13—13 in FIG. 11 to show the structure of the active device areas and the cross-section in FIG. 14 is taken through minority carrier bypass sites 160 along line 14—14 in FIG. 11 to illustrate the difference between these bypass sites 160 and the prior art bypass sites 60. In FIG. 14, an additional layer 127 of heavily doped P type material is included between N type layer 122 and lower electrode 142 in order to make the device an IGBT. The device in FIG. 13 would also be an IGBT if the layer 127 were included in it between layer 122 and electrode 142. The inclusion in FIG. 13 of a heavily doped portion 122b in region 122 adjacent electrode 142 provides good ohmic contact in a MOSFET between electrode 142 and region 122. In a MOSFET, the region 122 is the drain, the region 128 is the source, electrode 140 is the source electrode and electrode 142 is the drain electrode. The region 122 is often referred to as the drift region in both MOSFETs and IGTs.

In the inventive device of FIGS. 12–14, the P+ diffused region 24 has a width $W_e'$ where N+ emitter regions 128 are present and a width $W_b'$ at the minority carrier bypass sites 160 in which no emitter region is present. In this device $W_b'=W_e'$. In contrast, in the prior art device, the width $W_b$ of P+ region 24 at the minority carrier bypass sites is greater than its width $W_e$ at the emitter regions.

The P+ diffused regions 124 of the inventive device 100 have smooth edges without any spherical "corners" and have cylindrical edges having a straight axis along the straight edges of the diffused region and a curved (semicircular) axis at the rounded ends of the diffused region. This is most easily seen in FIG. 12. This curved axis cylindrical junction provides a significantly higher breakdown voltage than the spherical junction of the prior art device since it has less curvature than a spherical junction which results in a higher breakdown voltage for the same region thickness and doping concentration. Further, in this configuration the outer region of the base is lightly doped (P−) portion 126 in contrast to the prior art configuration where the outer portion of the base at the bypass sites is heavily doped (P+) portion 24. For similar junction curvatures, a junction having a heavy doping concentration on one side will break down at a lower voltage than one which is lightly doped on both sides. Thus, the structure in accordance with the invention increases breakdown voltage in two ways. First, by reducing the curvature of the junction and second, by reducing the base doping concentration at the outer edges of the base region. Thus, the round ended window in the polysilicon mask and other mask variations result in a device region in which the breakdown voltage of the PN junction is increased substantially above that of the spherical junctions present in the prior art device.

Due to the curvature of the junction at the rounded end of the diffused region 124, the junction breakdown voltage at the end of the diffused region is still not as high as the breakdown voltage of the straight cylindrical junction which extends along the straight edges of the diffused region and therefore the breakdown voltage at the ends of the diffused region remains the breakdown voltage limiting portion of the blocking junction 123 within the active portion of the device.

A multiple window embodiment of the device in accordance with the present invention is shown in plan view in FIG. 15. The windows 114 in gate electrode grid 112 are spaced apart vertically in the figure by the same distance $W_2$ as in the prior art device shown in FIG. 7 under similar criterion in order to provide a sufficiently wide column 122a (FIGS. 13 and 14) in which the current can flow vertically to reach the field effect controlled channels 129 (FIG. 13).

We have found that by shrinking the width $W_1'$ of the cross-connection segments 111 to significantly less than the width $W_2$, the rounded ends of laterally adjacent windows 114 can be brought close enough together that the diffused regions 126 extending therefrom merge under the doubly concave segment 111 of the gate (as shown by dashed lines 123 representing the surface intersections of junction 123 which overlap at 170), thereby eliminating the junction ends at those locations and making the P regions under a row of windows into a single, longer P region. Effectively, elimination of these diffused region ends and their associated junction portions converts the radius of curvature of the cylindrical axis from that limited by the width of the window (R=W/2) to the infinite (axis) radius of a straight cylindrical junction. The curves in the diffused region edges at the cusps under the cross-connection segments 111 have a greatly reduced effect on break down voltage as compared to complete semicircular ends because these curves form cusps. The merger of the diffused regions is shown in cross-section in FIG. 16 which is taken along the line 16—16 in FIG. 15 and shows the modified version of the structure in which $W_1'$ has been reduced so that the diffused regions under horizontally adjacent windows merge. The P+ diffused regions 124 have not merged because of the set back of the ends of the windows 116 in the P+ diffusion mask from the ends of windows 114 in the polysilicon gate as shown in FIG. 9, but the P— diffused regions 126 have merged end-to-end under the cross-connection 111 to such an extent that the combined diffused region 126/126 has a straight bottom in the plane of the figure except for the small cusp at the point of merger. This merged diffused region 126/126 has a side boundary which is essentially straight except for the small cusp at the point of merger as shown in FIG. 15. The merged diffused region 126/126 has a curvature along its sides which is essentially cylindrical with a straight axis or at least an axis which is much straighter than that of an isolated round end, since the curves forming a cusp are partially compensated by their mutual proximity. As a result of these changes, the overall breakdown voltage of the device structure is increased to essentially that of the straight cylindrical junctions along the straight sides of the base diffusions.

These increases in breakdown voltage exist both for static conditions in which the applied voltage is raised slowly with no current flow (other than leakage currents) and the dynamic turn off conditions created by turning off a current in an inductive load. The specific breakdown voltages for the static and dynamic cases are different, but these changes increase both and increase the device safe operating area because SOA is limited by breakdown in this portion of the device.

The device of FIG. 15 with merged diffused regions is fabricated by providing a gate mask which has protective regions which define the cross-connection segments 111 with a width $W_1$ which is smaller than the vertical width $W_2$ of the protective regions between vertically adjacent openings which define the gates segments 113 which space the windows vertically in FIG. 15. The resulting gate electrode grid 112 has wide segments 113 (width $W_2$) and narrower segments 111 (minimum width $W_1$). When the base region diffusions are driven, they are driven for a time which is sufficient to cause that diffusion to extend outward from the window along the semiconductor surface under the gate grid for a distance D which is greater than $\frac{1}{2}W_1$ and less than $\frac{1}{2}W_2$ so that the diffusions merge end-to-end (horizontally in FIG. 15), but not side-to-side (vertically in FIG. 15).

A P type IGT (i.e., having the region conductivity types reversed from those shown in the figures) having the previously-described prior art configuration can turn off a 26 amp current with a chip having an active area of 0.2 cm², while having a 400 volt breakdown voltage. For the 26 amp current, the current density at turn off is 150 A/cm². This current flow adds charge in the depletion layer of PN junction 123 within the body region 122 which is equal to $$N = J_F/qV_s$$

where $J_F$ is the current density and $V_S$ is the saturated drift velocity for electrons (minority carriers in this situation) which is $1 \times 10^7$ cm/sec at 300° K. in silicon. At a current of 130 A/cm², the resulting current-created charge in the drift region is $0.78 \times 10^{14}$/cm³. In a P— region having a resistivity of 150 ohm-cm which corresponds to a doping concentration of $0.9 \times 10^{14}$/cm³ these current conditions lead to a total charge concentration of $1.68 \times 10^{14}$/cm³ in the depletion region and a breakdown voltage of 400 volts results. A 400 volt breakdown voltage is considered to be the minimum adequate value for turning off an inductive load across a 110 volt ac line (315 volts peak-to-peak) without the use of extra protection circuitry such as a snubber capacitor.

With the round ended windows 114 in accordance with the present invention whose radius of curvature is half their width with the window width W equal to 16 microns, the window length L equal to 300 microns and the end-to-end spacing of the windows $W_1'$ and the vertical (in the plane of FIG. 15) spacing $W_2$ both equal to 16 microns (i.e., without the diffused region merger shown in FIG. 15), a breakdown voltage of 400 volts can be achieved with a total charge in the depletion layer of $2.6 \times 10^{14}$/cm³ which, for a resistivity of 150 ohm-cm, yields a permissible current induced charge of $1.7 \times 10^{14}/cm^3$ corresponding to a current density of 270 A/cm$^2$ which is 2.1 times the permissible current in the prior art device. Consequently, for the same operating characteristics, the chip size can be reduced by a factor of 2.1 which results in a substantial reduction in cost.

If the rounded ends of the windows 114 are brought closer together ($W_1'$ equal to 6 microns, for example), so that the diffused regions along the round ends of horizontally (in the plane of FIG. 12) adjacent windows merge and there is a single continuous diffused region extending along the entire length of a row of the windows 114, then the junction breakdown voltage increases to that of the straight cylindrical portion of the junction along the sides of that region so that the 400 volt breakdown can be achieved with a total depletion layer charge of $3 \times 10^{14}/cm^3$ which, for a P— resistivity of 150 ohm-cm, yields a permissible charge due to current of $2.1 \times 10^{14}/cm^3$. This corresponds to a current density of 336 A/cm$^2$. Consequently, the same 26 amp current can be handled by a chip which is 336/130 or 2.6 times smaller than the prior art chip.

Experimental devices (not fully optimized) in accordance with this invention (FIG. 15 with $W_1=6$ microns and merged diffusions) were fabricated by diffusion using chips of the same physical size ($6 \times 6$ mm) as commercial production versions of devices having the prior art structure shown in FIGS. 1-7. The doping levels and the region thicknesses in both device types were the same. The body regions (22 and 122) had doping concentrations of $0.9 \times 10^{14}/cm^3$, the base region high concentration portions (24 and 124) had surface dopant concentrations of $5 \times 10^{19}/cm^3$, the base region low concentration portions (26 and 126) had surface dopant concentrations of $2 \times 10^{17}/cm^3$ and the emitter regions (28 and 128) had surface dopant concentrations of $1 \times 10^{19}/cm^3$. The high concentration base region depth was about 6 microns, the low concentration base region depth was about 4 microns and the emitter depth was about 'micron. Some of the device characteristics are tabulated in the TABLE with the results for the inventive device normalized to the values for the prior art device.

TABLE

| Device Design | SOA Current (For 400 Volts) | Input Capacitance (Picofarads) |
| --- | --- | --- |
| Prior Art | 1 | 1 |
| This Invention | 1.75 | 0.9 |

The TABLE indicates that actual experimental devices in accordance with this invention have provided a safe operating current which is 1.75 times greater than that in the prior art device and have an input capacitance which is nine tenths of the prior art device's input capacitance. Thus, the inventive device provides a significant improvement over the prior art. Those skilled in the art will recognize that the invention is effective for wide ranges of dopant concentrations and region depths and does not depend on the specific doping levels present in these devices for its success.

Figure 17:
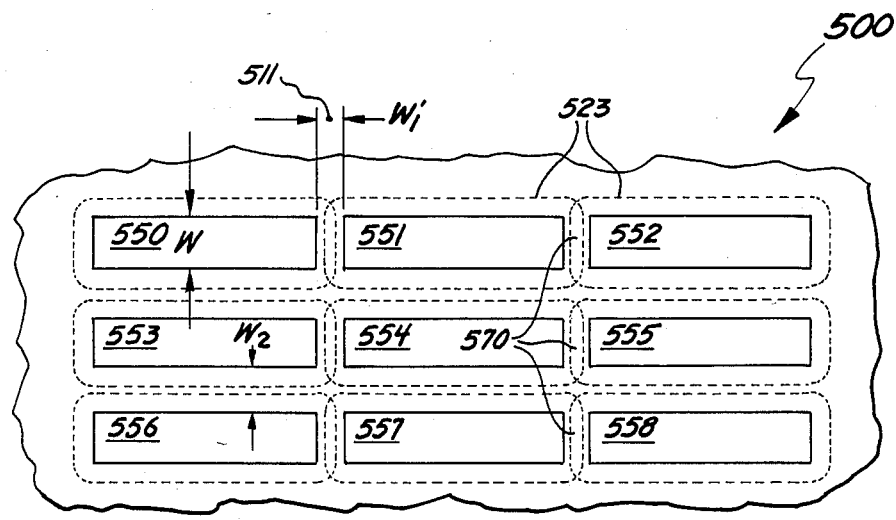
Figure 18:
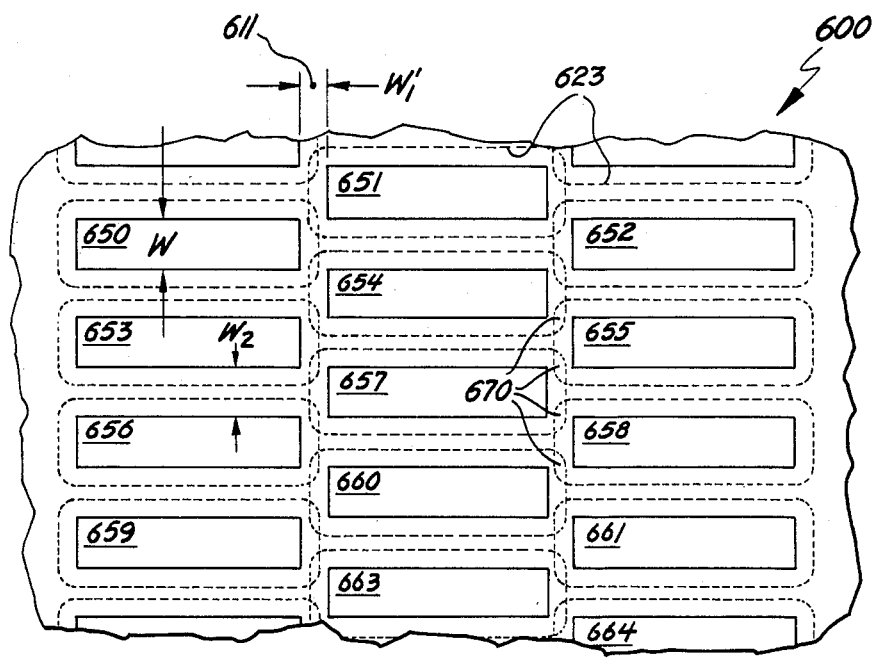

A similar diffused region merger effect can be achieved with rectangular windows having square ends with a corresponding improvement in the safe operating area of the device, and thus chip size. Two different alignments for such an array of rectangular openings in the gate electrode are shown in FIGS. 17 and 18 wherein the terms "horizontal" and "vertical" refer to the plane of the respective illustrations. In pattern 500 in FIG. 17, horizontally adjacent windows (such as 550 and 551 or 554 and 555) are aligned horizontally. Merger of some of their diffused regions are shown by the overlap at 570 of dashed lines 523 which represent the intersection of their associated blocking PN junctions with the semiconductor surface. However, for this configuration to match the breakdown voltage of the FIG. 15 merged region embodiment, the gate regions 511 may be narrower than the gate segments 111 which will result in higher gate grid resistance. In pattern 600 in FIG. 18, horizontally adjacent windows (such as 653 and 654 or 657) are offset in the vertical direction by half the vertical center-to-center spacing $W_2$ of adjacent vertically aligned windows whose vertical width W is equal to $W_2$. The PN junctions at the edges of the diffusion regions are shown by dashed lines 623 to demonstrate the merger of horizontally adjacent diffusions at 670 to form a grid-like diffused region. In both FIGS. 17 and 18, the breakdown voltage will approach that of a cylindrical junction having a straight axis because the spherical portions of each individual diffused region's boundary will have crossed into another individual diffused region thereby eliminating the spherical contour of the resulting PN junction. Thus, the gate segments 611 in FIG. 18 may be wider and lower resistance for the same breakdown voltage than the segments 511 in FIG. 17.

A further modification to the gate grid is shown in FIG. 19 as a device 700 in which the windows 714 in the gate grid 712 are provided with straight sides S and straight ends E which are connected by curved corners C whose radius of curvature $R_C$ is significantly larger than W/2. The length $L_e$ of the straight ends E is selected so that the diffusions emanating from the points where the ends E meet the curves C merge fully to leave a cusp formed by the portions of the diffusion emanating from the curves C which have a larger radius than is provided when semicircular window ends are used as in FIG. 15.

It will be understood by those skilled in the art that the improvement in device performance which this invention provides can be used in a variety of ways. As discussed above, for an IGBT, it can be used to reduce chip size for a given current and voltage limit on the device's SOA. For a power MOSFET, this invention can be used to give the drift region a higher doping level and make it thinner because of the narrower depletion region in more highly doped material. Both of these changes will reduce on-resistance for a given chip size and breakdown voltage. Other appropriate tradeoffs are made possible by the invention and their implementation is a matter of design choices and the specifications it is desired to meet.

Many variations on the structures in the illustrative embodiments are possible without departing from the spirit of the invention or the scope of the appended claims. By way of example, and not limitation, where the distance $W_1'$ is made small to cause end-to-end merger of the diffused regions, the unprotected region in the P+ mask 115 which, in FIG. 8, is a separate window 116 for each window 114 in the polysilicon can be changed into a single window for each horizontal row of windows 114. In this way, the P+ diffused regions 124 will merge end-to-end as has been described for the P— diffused regions 16. The conductivity types of all regions in any of the illustrated devices can be reversed to create a device of the opposite polarity. The high concentration base diffusion (P+ region 124) can be made shallower than the P− base diffusion (which would be made first) to eliminate the protrusion of the P+ diffusion 124 through the P− diffusion 126 which is seen most clearly in FIG. 12. This results in a high voltage blocking PN junction which is formed by two regions which have light doping concentrations. The polysilicon gate may be silicided for increased conductivity. Other gate materials may also be used. Devices in accordance with this invention can be made via diffusion from a dopant source which is provided by surface deposition or by ion implantation. In structures which do not use double diffusions to control channel length, the structure may also be formed by ion implantation followed by annealing of by other fabrication and doping techniques.

The invention is also useful with strictly bipolar devices such as bipolar power transistors.

Reducing the size of the chip has a significance beyond merely increasing the number of chips which can fit on a given wafer for fabrication which, for a constant yield, increases the number of good chips per wafer. In addition, the smaller chip size promotes an increase in yield. These effects combine to provide a substantial increase in the number of good chips per wafer and thus a substantial reduction in the cost per chip since the processing cost is allocated per wafer.

Our related, incorporated-by-reference, application improves on this invention to provide a still larger safe operating area.

Thus, a VDMOS device structure exhibiting increased safe operating area without (1) increased physical area, (2) increased resistance of the drift region or (3) significantly reduced gate conductivity has been shown and described.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A semiconductor field effect device comprising:
   a body of semiconductor material having a first major surface and including a first region of one type conductivity which extends to said first surface;
   an insulated gate electrode grid disposed over said first major surface, said grid having an array of openings therein, said grid including first segments having a minimum width $W_1$ and second segments having a minimum width $W_2$, wherein $W_2$ is greater than $W_1$;
   said semiconductor body further including a second region having an opposite type conductivity extending into said first region from said first surface, said second region underlying said openings and extending under said gate electrode grid from said openings parallel to said first major surface a distance D to form a PN junction with said first region, wherein $\frac{1}{2}W_2$ is greater than D which is greater than $\frac{1}{2}W_1$, said second region being interposed between said first region and said first major surface under said first grid segments.

2. The semiconductor field effect device recited in claim 1 wherein:
   said array of openings is a two-dimensional array;
   said first grid segments space said opening apart in a first direction;
   said second grid segments space said openings apart in a second direction.

3. The semiconductor field effect device recited in claim 2 wherein said first direction is perpendicular to said second direction.

4. The semiconductor field effect device recited in claim 3 wherein:
   said openings are disposed in second-direction extending columns which are spaced apart in said first direction by said width $W_1$; and
   adjacent ones of said openings along said first direction are aligned in said first direction.

5. The semiconductor field effect device recited in claim 4 wherein said openings are elongated with their long dimension oriented parallel to said first direction.

6. The semiconductor field effect device recited in claim 3 wherein:
   said openings are disposed in second-direction extending columns which are spaced apart in said first direction by said width $W_1$; and
   adjacent ones of said openings along said first direction are off-set in said second direction.

7. The semiconductor field effect device recited in claim 6 wherein said openings are elongated with their long dimensions oriented parallel to said first direction.

8. The semiconductor field effect device recited in claim 1 wherein:
   said semiconductor body further includes a plurality of spaced-apart third regions of said one type conductivity, each of said third regions disposed within said second region and extending under one of said second segments of said gate grid to define a field effect channel portion of said second region between that third region and said first region.

9. The semiconductor field effect device recited in claim 8 wherein said first region comprises first and second portions, said second portion being substantially more heavily doped than said first portion, said first portion spacing said second portion from said first region; and
   said device further comprising:
   a first main electrode contacting said second portion of said first region; and
   a second main electrode contacting said third region.

10. The semiconductor field effect device recited in claim 9 wherein said second main electrode also contacts said second region.

11. The semiconductor field effect device recited in claim 8 wherein:
    said semiconductor body further includes a fourth region of said opposite type conductivity disposed adjacent to and forming a PN junction with said first region, said fourth region spaced from said second and third regions by said first region.

12. The semiconductor field effect device recited in claim 11 further comprising:
    a first main electrode contacting said fourth region; and
    a second main electrode contacting said third regions.

13. The semiconductor field effect device recited in claim 12 wherein said second main electrode also contacts said second region.

14. The semiconductor field effect device recited in claim 1 wherein said second region includes separately doped portions having different concentrations of said opposite type dopant.

15. The semiconductor device recited in claim 14 wherein said second region includes:
a portion having a high concentration of an opposite conductivity type determining dopant which at said first major surface is spaced from the edges of said second region by a portion having a substantially lower concentration of an opposite conductivity type determining dopant.

16. A semiconductor field effect device comprising:
a body of semiconductor material having a first major surface;
an insulated gate electrode grid disposed on said first major surface and having an array of openings therein;
said openings being spaced apart in a first direction by a distance $W_1$ and in a second direction by a distance $W_2$, wherein $W_2$ is greater than $W_1$;
said body including a diffused region under each of said openings, each said diffused region extending under said gate electrode a distance D, wherein $\frac{1}{2}W_2$ is greater than D which is greater than $\frac{1}{2}W_1$ whereby said diffused regions under adjacent ones of said openings along said first direction merge to form a single region and said diffused regions under adjacent ones of said openings along said second direction are spaced apart from each other.

17. The semiconductor device recited in claim 16 wherein:
said semiconductor material comprises:
a first region having one type conductivity,
each of said diffused regions comprising a second region having an opposite type conductivity extending into said first region from said first major surface to form a high voltage blocking PN junction with said first region, and
a plurality of third regions of said one type conductivity, each of said third regions extending into said second region from said first surface and being spaced from said first region;
said insulated gate overlying portion of said second region which spaces each of said third regions from said first region along said first major surface to control conduction within a channel through said portion of said second region between said first and third regions; and said device further comprises:
a first main electrode contacting said first region, and
a second main electrode contacting said second and third regions.

18. The semiconductor device recited in claim 16 wherein:
said semiconductor material comprises:
a first region having one type conductivity,
a second region having an opposite type conductivity disposed adjacent said first region and said first surface,
each of said diffused regions comprising a third region having said one type conductivity extending into said second region from said first major surface to form a high voltage blocking PN junction with said second region, and
a plurality of fourth regions of said opposite type conductivity, each of said fourth regions extending into said third region from said first major surface and being spaced from said second region,
said insulated gate overlying a portion of said third region which spaces each of said fourth regions from said second region along said first major surface to control conduction within a channel through said portion of said third region between said second and fourth regions; and said semiconductor device further comprises:
a first main electrode contacting said first region, and
a second main electrode contacting said third and fourth regions.

19. A semiconductor field effect device comprising:
a body of semiconductor material having a first major surface and including a first region of one type conductivity therein;
an insulated gate electrode grid disposed on said first major surface having a plurality of openings therein; and
a second region of opposite type conductivity extending into said first region, underlying said openings and extending under said gate electrode grid from said openings a first distance in a plane parallel to said first major surface and forming a PN junction with said first region;
said openings being spaced apart at first locations by a distance of less than twice said first distance and at second locations by a distance of more than twice said first distance, whereby said second region is continuous beneath said first locations and discontinuous beneath said second locations.

20. The semiconductor field effect device recited in claim 19 wherein said first and second locations are configured to define a grid structure such that dopants diffused therethrough extend under all of said openings and form gaps in the diffused dopants in the vicinity of said second locations.

21. The semiconductor field effect device recited in claim 19 wherein each of said openings is elongated with its own ends spaced apart by at least twice the distance between its own sides.

22. The semiconductor field effect device recited in claim 19 wherein said PN junction is configured to exhibit a breakdown voltage under said ends of said openings which is substantially as high as that along the sides of said openings.

23. A semiconductor device comprising:
a body of semiconductor material having a first major surface;
an insulation grid disposed on said first major surface and having an array of openings therein;
said openings being spaced apart in a first direction by a distance $W_1$ and in a second direction by a distance $W_2$, wherein $W_2$ is greater than $W_1$;
said body including a diffused region under each of said openings, each said diffused region extending under said insulation a distance D, wherein $\frac{1}{2}W_2$ is greater than D which is greater than $\frac{1}{2}W_1$ whereby said diffused regions under adjacent ones of said openings along said first direction merge to form a single region and said diffused regions under adjacent ones of said openings along said second direction are spaced apart from each other.

* * * * *